United States Patent
Bean et al.

(10) Patent No.: US 8,347,641 B2
(45) Date of Patent: *Jan. 8, 2013

(54) SUB-COOLING UNIT FOR COOLING SYSTEM AND METHOD

(75) Inventors: John H. Bean, Wentzville, MO (US); Jonathan M. Lomas, Blythewood, SC (US)

(73) Assignee: American Power Conversion Corporation, West Kingston, RI (US)

( * ) Notice: Subject to any disclaimer, the term of this patent is extended or adjusted under 35 U.S.C. 154(b) by 351 days.

This patent is subject to a terminal disclaimer.

(21) Appl. No.: 12/857,213

(22) Filed: Aug. 16, 2010

(65) Prior Publication Data

US 2011/0023508 A1 Feb. 3, 2011

Related U.S. Application Data

(63) Continuation of application No. 12/181,714, filed on Jul. 29, 2008, now Pat. No. 7,775,055, which is a continuation of application No. 11/243,628, filed on Oct. 5, 2005, now Pat. No. 7,406,839.

(51) Int. Cl.
*F25B 5/00* (2006.01)

(52) U.S. Cl. ............................................. 62/117; 62/513

(58) Field of Classification Search .................. 62/513, 62/510, 310, 200, 199, 175, 117, 498, DIG. 2
See application file for complete search history.

(56) References Cited

U.S. PATENT DOCUMENTS

| | | |
|---|---|---|
| 3,559,728 A | 2/1971 | Lyman et al. |
| 3,681,936 A | 8/1972 | Park |
| 4,127,008 A | 11/1978 | Tyree, Jr. |
| 4,197,716 A | 4/1980 | Nussbaum |
| 4,275,570 A | 6/1981 | Szymaszek et al. |
| 4,285,205 A | 8/1981 | Martin et al. |
| 4,419,865 A | 12/1983 | Szymaszek |
| 4,515,746 A | 5/1985 | Brun et al. |
| 4,590,538 A | 5/1986 | Cray, Jr. |
| 4,599,873 A | 7/1986 | Hyde |
| 4,696,168 A | 9/1987 | Woods et al. |
| 4,774,631 A | 9/1988 | Okuyama et al. |
| 4,837,663 A | 6/1989 | Zushi et al. |
| 4,911,231 A | 3/1990 | Horne et al. |
| 5,057,968 A | 10/1991 | Morrison |
| 5,088,292 A * | 2/1992 | Champagne et al. ............. 62/84 |
| 5,095,712 A | 3/1992 | Narreau |

(Continued)

FOREIGN PATENT DOCUMENTS

EP 1610077 A2 12/2005

(Continued)

OTHER PUBLICATIONS

"Essential Cooling System Requirements for Next Generation Data Centers," White Paper #5, Revision 3, 2003 American Power Conversion, Rev 2002-3, pp. 1-10.

(Continued)

*Primary Examiner* — Mohammad Ali
(74) *Attorney, Agent, or Firm* — Lando & Anastasi, LLP

(57) ABSTRACT

A system for cooling a medium includes a line having coolant flowing therein, and a sub-cooling unit in fluid communication with the line. The sub-cooling unit receives a portion of the coolant diverted from the line to cool coolant flowing in the line. A method of cooling a medium is further disclosed.

20 Claims, 2 Drawing Sheets

U.S. PATENT DOCUMENTS

| | | | |
|---|---|---|---|
| 5,108,548 A * | 4/1992 | Keane et al. | 202/182 |
| 5,150,580 A | 9/1992 | Hyde | |
| 5,158,132 A | 10/1992 | Guillemot | |
| 5,173,819 A | 12/1992 | Takahashi et al. | |
| 5,174,123 A * | 12/1992 | Erickson | 62/113 |
| 5,177,666 A | 1/1993 | Bland et al. | |
| 5,383,339 A * | 1/1995 | McCloskey et al. | 62/238.5 |
| 5,582,020 A | 12/1996 | Scaringe et al. | |
| 5,649,428 A | 7/1997 | Calton et al. | |
| 5,657,641 A | 8/1997 | Cunningham et al. | |
| 5,694,780 A | 12/1997 | Alsenz | |
| 5,749,237 A | 5/1998 | Sandofsky et al. | |
| 5,967,283 A | 10/1999 | Kemper | |
| 5,972,196 A | 10/1999 | Murphy et al. | |
| 6,032,472 A | 3/2000 | Heinrichs et al. | |
| 6,047,556 A * | 4/2000 | Lifson | 62/196.2 |
| 6,111,036 A | 8/2000 | Wonders et al. | |
| 6,170,270 B1 * | 1/2001 | Arshansky et al. | 62/81 |
| 6,213,194 B1 | 4/2001 | Chrysler et al. | |
| 6,237,353 B1 | 5/2001 | Sishtla et al. | |
| 6,305,180 B1 | 10/2001 | Miller et al. | |
| 6,459,579 B1 | 10/2002 | Farmer et al. | |
| 6,474,087 B1 | 11/2002 | Lifson | |
| 6,494,050 B2 | 12/2002 | Spinazzola et al. | |
| 6,662,576 B1 | 12/2003 | Bai | |
| 6,668,565 B1 | 12/2003 | Johnson et al. | |
| 6,675,609 B2 * | 1/2004 | Takeuchi et al. | 62/500 |
| 6,695,577 B1 | 2/2004 | Susek | |
| 6,718,781 B2 | 4/2004 | Freund et al. | |
| 6,745,590 B1 | 6/2004 | Johnson et al. | |
| 6,775,137 B2 | 8/2004 | Chu et al. | |
| 6,848,989 B2 | 2/2005 | Miyazaki et al. | |
| 6,859,366 B2 | 2/2005 | Fink | |
| 6,871,509 B2 * | 3/2005 | Grabon et al. | 62/201 |
| 6,880,349 B2 | 4/2005 | Johnson et al. | |
| 6,955,058 B2 | 10/2005 | Taras et al. | |
| 6,967,283 B2 | 11/2005 | Rasmussen et al. | |
| 6,973,797 B2 | 12/2005 | Nemit, Jr. | |
| 6,980,433 B2 | 12/2005 | Fink | |
| 7,017,357 B2 * | 3/2006 | Brasz | 62/115 |
| 7,033,267 B2 | 4/2006 | Rasmussen | |
| 7,046,514 B2 | 5/2006 | Fink et al. | |
| 7,051,802 B2 | 5/2006 | Baer | |
| 7,106,590 B2 | 9/2006 | Chu et al. | |
| 7,112,131 B2 | 9/2006 | Rasmussen et al. | |
| 7,120,021 B2 | 10/2006 | Hamman | |
| 7,140,193 B2 | 11/2006 | Johnson et al. | |
| 7,145,772 B2 | 12/2006 | Fink | |
| 7,148,796 B2 | 12/2006 | Joy et al. | |
| 7,162,878 B2 * | 1/2007 | Narayanamurthy et al. | 62/59 |
| 7,165,412 B1 | 1/2007 | Bean, Jr. | |
| 7,173,820 B2 | 2/2007 | Fink et al. | |
| 7,228,707 B2 | 6/2007 | Lifson et al. | |
| 7,278,273 B1 | 10/2007 | Whitted et al. | |
| 7,406,839 B2 | 8/2008 | Bean et al. | |
| 7,775,055 B2 | 8/2010 | Bean et al. | |
| 2001/0042616 A1 | 11/2001 | Baer | |
| 2003/0042004 A1 | 3/2003 | Novotny et al. | |
| 2003/0184975 A1 | 10/2003 | Steinman et al. | |
| 2004/0099747 A1 | 5/2004 | Johnson et al. | |
| 2004/0100770 A1 | 5/2004 | Chu et al. | |
| 2004/0120855 A1 | 6/2004 | Reichel et al. | |
| 2004/0190247 A1 | 9/2004 | Chu et al. | |
| 2005/0170770 A1 | 8/2005 | Johnson et al. | |
| 2005/0225936 A1 | 10/2005 | Day | |
| 2005/0237715 A1 | 10/2005 | Staben et al. | |
| 2005/0237716 A1 | 10/2005 | Chu et al. | |
| 2006/0082263 A1 | 4/2006 | Rimler et al. | |
| 2006/0102575 A1 | 5/2006 | Mattlin et al. | |
| 2006/0126296 A1 | 6/2006 | Campbell et al. | |
| 2006/0139877 A1 | 6/2006 | Germagian et al. | |
| 2006/0162357 A1 | 7/2006 | Fink et al. | |
| 2006/0232945 A1 | 10/2006 | Chu et al. | |
| 2006/0260338 A1 | 11/2006 | VanGilder et al. | |
| 2006/0276121 A1 | 12/2006 | Rasmussen | |
| 2007/0038414 A1 | 2/2007 | Rasmussen et al. | |
| 2007/0072536 A1 | 3/2007 | Johnson et al. | |
| 2007/0076373 A1 | 4/2007 | Fink | |
| 2007/0078635 A1 | 4/2007 | Rasmussen et al. | |
| 2007/0085678 A1 | 4/2007 | Joy et al. | |
| 2007/0163748 A1 | 7/2007 | Rasmussen et al. | |
| 2007/0165377 A1 | 7/2007 | Rasmussen et al. | |
| 2007/0167125 A1 | 7/2007 | Rasmussen et al. | |
| 2007/0174024 A1 | 7/2007 | Rasmussen et al. | |

FOREIGN PATENT DOCUMENTS

| | | |
|---|---|---|
| JP | 2001-260640 A | 9/2001 |
| JP | 2002-156161 A | 5/2002 |
| JP | 2003-083620 A | 3/2003 |

OTHER PUBLICATIONS

Neil Rasmussen, "Avoidable Mistakes that Compromise Cooling Performance in Data Centers and Network Rooms," White Paper #49, 2003 American Power Conversion, Rev 2003-0, pp. 1-15.

Neil Rasmussen, "Cooling Options for Rack Equipment with Side-to-Side Airflow," White Paper #50, 2004 American Power Conversion, Rev 2004-0, pp. 1-14.

Neil Rasmussen, "Air Distribution Architecture Options for Mission Critical Facilities," White Paper #55, Revision 1, 2003 American Power Conversion, Rev 2003-0, pp. 1-13.

"How and Why Mission-Critical Cooling Systems Differ From Common Air Conditions," White Paper #56, Revision 2, 2003 American Power Conversion, Rev 2003-2, pp. 1-13.

Tony Evans, "Fundamental Principles of Air Conditioners for Information Technology," White Paper #57, Revision 1, 2004 American Power Conversion, Rev 2004-1, pp. 1-9.

Tony Evans, "Humidification Strategies for Data Centers and Network Rooms," White Paper 58, 2004 American Power Conversion, Rev 2004-0, pp. 1-13.

Tony Evans, "The Different Types of Air Conditioning Equipment for IT Environments," White Paper #59, 2004 American Power Conversion, Rev 2004-0, pp. 1-21.

Neil Rasmussen, "Guidelines for Specification of Data Center Power Density," White Paper #120, 2005 American Power Conversion, Rev 2005-0, pp. 1-21.

International Search Report for PCT/US2006/037772 mailed Jul. 10, 2007.

* cited by examiner

SUB-COOLING UNIT FOR COOLING SYSTEM AND METHOD

CROSS-REFERENCE TO RELATED APPLICATIONS

This application is a continuation of U.S. patent application Ser. No. 12/181,714, filed on Jul. 29, 2008, which is a continuation of U.S. patent application Ser. No. 11/243,628, filed on Oct. 5, 2005 (now U.S. Pat. No. 7,406,839), both of which are incorporated herein by reference in their entirety for all purposes.

BACKGROUND OF THE INVENTION

1. Field of the Invention

The present invention relates to cooling systems, and more particularly to cooling systems used with racks and enclosures used for data processing, networking and telecommunications equipment.

2. Discussion of Related Art

Communications and information technology equipment is commonly designed for mounting on racks and for housing within enclosures (often included in the term "rack"). Equipment racks are used to contain and to arrange communications and information technology equipment, such as servers, CPUs, data processing equipment, networking equipment, telecommunications equipment and storage devices, in relatively small wiring closets as well as equipment rooms and large data centers. An equipment rack can be an open configuration or can be housed within a rack enclosure, although the enclosure may be included when referring to a rack. A standard rack typically includes front-mounting rails to which multiple units of equipment, such as servers and CPUs, are mounted and stacked vertically, for example, within the rack. A standard rack at any given time can be sparsely or densely populated with a variety of different components (e.g., server blades) as well as with components from different manufacturers.

Most rack-mounted communication and information technology equipment consumes electrical power and generates heat, which can have an adverse effect on the performance, reliability and useful life of the equipment components. In particular, rack-mounted equipment housed within an enclosure is particularly vulnerable to heat build-up and hot spots produced within the confines of the enclosure during operation. The amount of heat generated by a rack of equipment is dependent on the amount of electrical power drawn by equipment in the rack during operation. The amount of heat a given rack or enclosure can generate, therefore, may vary considerably from a few tens of watts up to about 40,000 watts, and this upper end continues to increase with the constant evolution of this technology.

In some embodiments, rack-mounted equipment is cooled by drawing air along a front side or air inlet side of a rack, drawing air through its components, and subsequently exhausting air from a rear or vent side of the rack. Airflow requirements to provide sufficient air for cooling can vary considerably as a result of different numbers and types of rack-mounted components and different configurations of racks and enclosures.

Equipment rooms and data centers are typically equipped with an air conditioning or cooling system that supplies and circulates cool air to racks. One such cooling system employs a raised floor to facilitate air conditioning and circulation systems. Such systems typically use open floor tiles and floor grills or vents to deliver cool air from an air passageway disposed below the raised floor of an equipment room. Open floor tiles and floor grills or vents are typically located in front of equipment racks, and along aisles between rows of racks arranged side-by-side.

One cooling system is disclosed in co-pending U.S. patent application Ser. No. 10/993,329, entitled IT EQUIPMENT COOLING, filed on Nov. 19, 2004, which is owned by the assignee of the present application and is incorporated herein by reference. In one embodiment, this system includes one or more main condensing modules, a coolant distribution section, a heat exchanger module section, and a backup coolant section. The coolant distribution section includes a bulk storage tank, an evacuation/recovery pump, a manifold and hoses. The condensing module(s) sends cool liquid to the heat exchanger module section by means of the distribution section, where the liquid is evaporated, into gas by hot air from the IT equipment, and the vapor coolant is returned to the main condensing module(s). At the main condensing module(s), a primary cooling portion cools the heated vapor coolant back into a liquid for supply to the heat exchanger module section by the distribution section. In the case of a failure of one of the primary condensing modules, a secondary condensing module can cool and condense the heated vapor coolant if power has not failed to the system. If power has failed to the system, the backup coolant section, which may include several ice storage tanks, can continue to cool, without using high power consumption vapor compression systems, the heated coolant from the heat exchange module section for the duration of battery life or depletion of ice storage of the system.

BRIEF SUMMARY OF THE INVENTION

One aspect of the invention is directed to a system for cooling a medium. In one embodiment, the system comprises a line having coolant flowing therein, and a sub-cooling unit in fluid communication with the line. The sub-cooling unit receives a portion of the coolant diverted from the line to cool coolant flowing in the line.

Embodiments of the system may include the sub-cooling unit comprising a sub-cooling expansion device in fluid communication with the line, a sub-cooling heat exchanger, in fluid communication with the sub-cooling expansion device, to absorb heat from the coolant flowing in the line, and a sub-cooling pump, in fluid communication with the sub-cooling heat exchanger, to pump the portion of diverted coolant to the line. In one embodiment, the sub-cooling heat exchanger comprises a co-axial condensing unit in fluid communication with the line and the sub-cooling unit. In one embodiment, the portion of coolant diverted to the sub-cooling unit is less than 5% of the liquid coolant flowing through the line. In a particular embodiment, the portion of coolant diverted to the sub-cooling unit is approximately 2% of the liquid coolant flowing through the line. The system may comprise a condensing unit, in fluid communication with the line, adapted to cool coolant from a substantially vaporized state to a substantially liquid state, and a main pump, in fluid communication with the condensing unit by the line, adapted to pump coolant in liquid state. The system may further comprise a controller to control the operation of the cooling system. The controller controls the portion of coolant diverted from the line connecting the condensing unit to the main pump.

Another aspect of the invention is directed to a system for cooling a medium, the system comprising a line having coolant flowing therein, and means for cooling the coolant flowing through the line by diverting a portion of coolant from the line and absorbing heat from the coolant flowing through the line with the portion of diverted coolant.

In certain embodiments, the means for cooling the coolant flowing through the line comprises a sub-cooling unit, in fluid communication with the line, the sub-cooling unit receiving the portion of the coolant diverted from the line. The sub-cooling unit comprises a sub-cooling expansion device in fluid communication with the line, a sub-cooling heat exchanger, in fluid communication with the sub-cooling expansion device, to absorb heat from the coolant flowing in the line, and a sub-cooling pump, in fluid communication with the sub-cooling heat exchanger, to pump the portion of diverted coolant to the line. The sub-cooling heat exchanger comprises a co-axial condensing unit in fluid communication with the line and the sub-cooling unit. The system further comprises a condensing unit, in fluid communication with the line, adapted to cool coolant from a substantially vaporized state to a substantially liquid state, and a main pump, in fluid communication with the condensing unit via the line, adapted to pump coolant in liquid state. The system may further comprise a controller to control the operation of the cooling system, wherein the controller controls the portion of coolant diverted from the line connecting the condensing unit to the main pump. In one embodiment, the portion of coolant diverted to the sub-cooling unit is less than 5% of the liquid coolant flowing through the line. In a particular embodiment, the portion of coolant diverted to the sub-cooling unit is approximately 2% of the liquid coolant flowing through the line.

A further aspect of the invention is directed to a method of cooling coolant within a line. The method comprises diverting a portion of coolant flowing through the line to a sub-cooling unit, and absorbing heat from the coolant flowing through the line with the portion of coolant diverted to the sub-cooling unit.

Embodiments of the method may further comprise pumping the portion of coolant back to the line. In one embodiment, the portion of coolant diverted to the sub-cooling unit is less than 5% of the coolant flowing through the line. In a particular embodiment, the portion of coolant diverted to the sub-cooling unit is approximately 2% of the coolant flowing through the line.

Yet another aspect of the invention is directed to a cooling system comprising a condensing unit adapted to cool coolant from a substantially vaporized state to a substantially liquid state. The system further includes a main pump, in fluid communication with the condensing unit, adapted to pump coolant, and a sub-cooling unit in fluid communication with the condensing unit. The sub-cooling unit receives a portion of coolant diverted from the condensing unit to the main pump to cool the coolant flowing from the condensing unit the main pump.

Embodiments of the invention may include the sub-cooling unit comprising a sub-cooling expansion device in fluid communication with the condensing unit, a sub-cooling heat exchanger, in fluid communication with the sub-cooling expansion device, adapted to absorb heat from coolant flowing from the condensing unit to the main pump, and a sub-cooling pump, in fluid communication with the sub-cooling heat exchanger and the condensing unit, adapted to pump the diverted coolant back to the condensing unit. The sub-cooling heat exchanger comprises a co-axial condensing unit in fluid communication with the condensing unit and the sub-cooling unit. The system may further include a controller to control the operation of the cooling system, wherein the controller controls the portion of coolant diverted from the condensing unit to the main pump. In one embodiment, the portion of coolant diverted to the sub-cooling unit is less than 5% of the liquid coolant flowing from the condensing unit to the main pump. In a particular embodiment, the portion of coolant diverted to the sub-cooling unit is approximately 2% of the liquid coolant flowing from the condensing unit to the main pump.

The present invention will be more fully understood after a review of the following figures, detailed description and claims.

BRIEF DESCRIPTION OF THE DRAWINGS

For a better understanding of the present invention, reference is made to the figures which are incorporated herein by reference and in which.

DETAILED DESCRIPTION OF THE INVENTION

Figure 1:
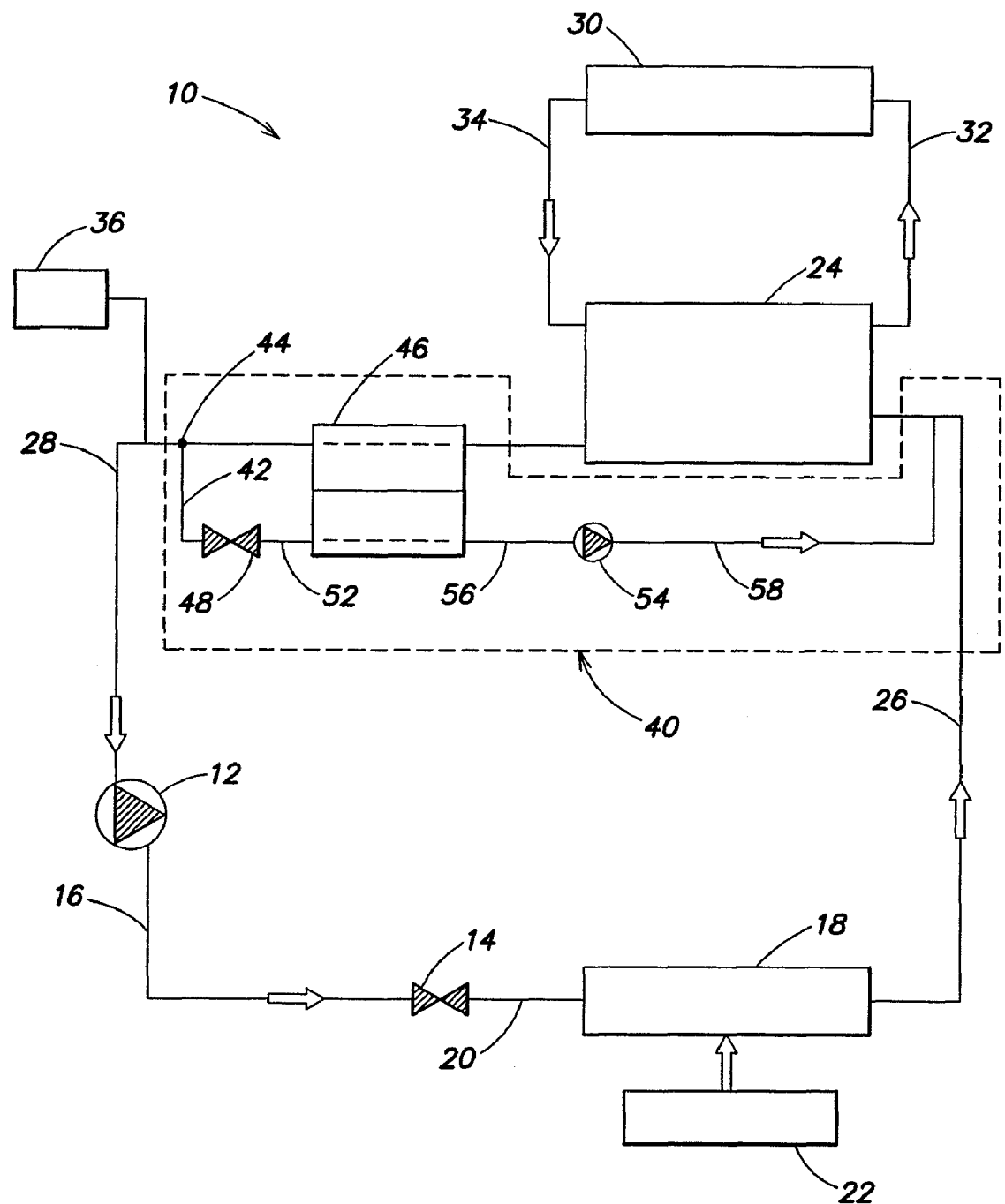
FIG. 1 is a schematic representation of a system for cooling an enclosure or rack having a sub-cooling unit of an embodiment of the invention for cooling coolant flowing from a condensing unit to a pump.

For the purposes of illustration only, and not to limit the generality, the present invention will now be described in detail with reference to the accompanying figures. This invention is not limited in its application to the details of construction and the arrangement of components set forth in the following description or illustrated in the drawings. The invention is capable of other embodiments and of being practiced or being carried out in various ways. Also the phraseology and terminology used herein is for the purpose of description and should not be regarded as limiting. The use of "including," "comprising," "having," "containing" "involving," and variations thereof herein, is meant to encompass the items listed thereafter and equivalents thereof as well as additional items.

Referring to the drawings, and more particularly to FIG. 1, there is generally indicated at 10 a system for cooling a space containing, for example, electronic equipment, including closets, equipment rooms and data centers. Such spaces are adapted to house enclosures or racks designed to house networking, telecommunication and other electronic equipment. In one embodiment, the cooling system 10 may be employed in the type of cooling system disclosed in U.S. patent application Ser. No. 10/993,329, entitled IT EQUIPMENT COOLING, filed on Nov. 19, 2004, which is referenced above and incorporated herein by reference. As discussed in greater detail below, the cooling system 10 of embodiments of the present invention is designed to improve the efficiency and reliability of the entire cooling system by diverting a portion of coolant from a condensing unit to a pump to further sub-cool the coolant being delivered to the pump.

As shown in FIG. 1, a medium or coolant, such as but not limited to R134A and R410A coolants, is provided within a closed system comprising a main pump 12, which is designed to pump liquid coolant. The liquid coolant is disposed within the closed system under increased pressure provided by the main pump 12. In one embodiment, the main pump 12 may embody two centrifugal pumps placed in series, which are capable of increasing the overall pressure of the coolant between 20-25 psig, for example. In this embodiment, the pumps may be of the type sold by Tark Incorporated of Dayton, Ohio, under model no. WRD40.5A-23. However, a single pump capable of achieving an overall pressure increase of 20-25 psig may be provided and still fall within the scope of the present invention.

The main pump 12 delivers the liquid coolant under increased pressure to an expansion valve 14, which is in fluid communication with the main pump via line 16. The expansion valve 14 conditions the coolant so that the coolant experiences a slight pressure and temperature drop after flowing through the expansion valve. In one embodiment, the expansion valve 14 may be of the type sold by the Sporlan Division of Parker-Hannifin Corporation of Washington, Mo., under model no. OJE-9-C-⅝"-⅝" ODF-5'.

Once through the expansion valve 14, the coolant, in a form of low pressure liquid/vapor mix (80% liquid and 20% vapor), flows through at least one evaporator unit 18 in fluid communication with the expansion valve 14 via line 20. In one embodiment, the evaporator unit 18 may take the form of a tubular coil having fins that are adapted to absorb heat from a space, such as hot air taken from the aforementioned closet, equipment room or data center. Such an evaporator unit 18 may be a micro-channel evaporator having two rows, 25.4 mm micro-channel coil assembly that is manufactured by and commercially available from Heatcraft of Grenada, Miss. In other embodiments, the evaporator unit may be adapted to absorb heat from another medium, such as heated coolant delivered to the evaporator unit, in which the heated medium contains heat taken from the space requiring cooling.

As shown in FIG. 1, a heat load 22 from the space requiring cooling is applied to the evaporator unit 18. The heat from the heat load 22, which may be in the form of warm air directed by fans from equipment enclosures at the evaporator unit 18, vaporizes the slightly reduced-pressure coolant traveling through the evaporator unit. Thus, the temperature of the vapor coolant flowing within the evaporator unit 18 is greater than the temperature of the low pressure liquid/vapor mix entering the inlet of the evaporator unit via line 20. Although the temperature is greater, the resultant pressure of the vapor coolant exiting the evaporator unit 18 is substantially equal to the pressure of the low pressure liquid/vapor mix.

The vapor coolant, which is in super heated condition, flows under relatively low pressure to a condensing unit 24, such as a condensing unit manufactured by WTT America, Inc. of Bohemia, N.Y. under model no. WTT W9-130. As shown, the condensing unit 24 is in fluid communication with the evaporator unit 18 and the main pump 12 via lines 26, 28, respectively. It should be noted that the super heated vapor coolant discharged from the evaporator unit 18 and traveling to the condensing unit 24 experiences a slight pressure loss in line 26. The condensing unit 24 is designed to cool the super heated vapor coolant entering the condensing unit and return the cooled coolant in a liquid state to the main pump 12 via line 28. As discussed above, given the design of the main pump 12, a requirement of the cooling system 10 is that coolant entering the main pump be in a liquid state.

In one embodiment, coolant requiring cooling within the condensing unit 24 may be subjected to a heat exchanger 30 in the form of a chilling unit, which is adapted to provide chilled water (e.g., approximately 45° F. water) in direct fluid communication with the condensing unit via lines 32, 34. The arrangement is such that chilled water entering the condensing unit 24 via line 34 cools the vaporized coolant to a liquid state. Warmer water (e.g., approximately 52° F. water) flows back to a chiller plant via line 32 for further cooling. Liquid coolant is then directed from the condensing unit 24 to the main pump 12, where the cycle of pumping, expanding, heating and cooling the coolant begins again.

A controller 36, such as the controller disclosed in the above-referenced patent application Ser. No. 10/993,329, is configured to control the operation of the cooling system 10 illustrated in FIG. 1. The main pump inlet conditions at line 28 are critical in two-phase pumped coolant systems because liquid pumps, such as main pump 12, require 100% liquid. To run efficiently, and to prevent failure of the main pump 12, sub-cooled liquid coolant is desirable. Specifically, as the condensing unit 24 cools vapor coolant via the heat exchanger 30, and "acceptable" liquid coolant (coolant that is sufficiently cooled to liquid phase) is directed to the main pump 12, the acceptable coolant may not be sufficiently cooled for the main pump to operate properly. Stated another way, it is desirable for all of the coolant entering the main pump 12 be in a liquid state. Otherwise, cavitation and/or vapor lock may result in the incapacitation of the main pump 12. Failure of the main pump 12 may result in the catastrophic failure of the cooling system 10, thereby jeopardizing the continued operation of the electronic equipment requiring cooling.

Often, due to environmental conditions, for example, it is difficult to cool coolant within the outlet of the condensing unit 24 to a temperature sufficient to ensure that the coolant is in a liquid state prior to its delivery to the main pump. Since the temperature of the outlet of the condensing unit 24 within line 28 is near the temperature of the coolant requiring further cooling by the heat exchanger, there is sometimes a need to further sub-cool the coolant to ensure that 100% of the coolant delivered to the main pump 12 is in liquid state. One way to achieve this lower temperature is to provide a separate cooling system, e.g., water chillers, in conjunction with another, oversized condensing unit. However, such approaches are expensive to install and operate, and are not practical in most applications.

Still referring to FIG. 1, there is illustrated the cooling system 10 with a sub-cooling unit, generally indicated at 40, of an embodiment of the present invention. As shown, the sub-cooling unit 40 is disposed generally between the condensing unit 24 and the main pump 12 so that it is in fluid communication with these components of the cooling system 10 in the manner described below. Specifically, as described above, coolant cooled by the condensing unit 24 is directed to the main pump 12 via line 28. With embodiments of the present invention, a small portion of the coolant is diverted by line 42 to the sub-cooling unit 40 for further cooling. In some embodiments, the mass of coolant diverted to line 42 is less than 5% of the total mass of coolant delivered to the main pump 12 from the condensing unit 24. In a preferred embodiment, the mass of coolant diverted to line 42 from the main pump 12 is approximately 2% of the total mass of coolant delivered.

The controller 36, which is in electrical communication with a valve at 44, may be configured to determine the amount of coolant diverted based on the environmental conditions of the coolant at the main pump 12 and within the sub-cooling unit 40. The remaining coolant, i.e., the non-diverted coolant, continues to flow to the main pump 12 via line 28. As will be described in greater detail below, the coolant delivered to the main pump 12 is cooled to a sufficiently cool temperature (depending on the type of coolant employed and the environmental conditions impacting the cooling system 10) to ensure the coolant is in a liquid state.

Before being diverted, the coolant flows from the condensing unit 24 through a heat exchanger 46 disposed between the condensing unit 24 and the main pump 12. In one embodiment, the heat exchanger 46 comprises a co-axial condensing unit having concentric tubes. The arrangement is such that coolant exiting the condensing unit 24 via line 28 flows within an inner tube (not shown) of the co-axial condensing unit 46 and coolant diverted to line 42 flows within an outer tube (not shown) of the co-axial condensing unit that houses the inner tube therein. Co-axial condensing units are well known in the art, and may be of the type offered by Packless Industries of Waco, Tex. under model no. AES003522. As discussed in greater detail below, it is within this co-axial condensing unit 46 that the coolant flowing from the condensing unit 24 to the main pump 12 by line 28 is cooled by the coolant diverted to the sub-cooling unit 40.

As shown in FIG. 1, the sub-cooling unit 40 includes a sub-cooling expansion valve 48 connected to line 42 to reduce the pressure and the temperature of the coolant diverted to the sub-cooling unit. In some embodiments, the sub-cooling expansion valve 48 may be replaced by a capillary tube or restrictive orifice. In one embodiment, the sub-cooling expansion valve may be of the type sold by the Sporlan Division of Parker-Hannifin Corporation of Washington, Mo., under the SJ series of expansion valves.

As stated above, the heat exchanger 46 (i.e., the co-axial condensing unit) receives coolant from the sub-cooling expansion valve 48 via line 52, so that the coolant flowing through the outer tube absorbs heat from the coolant flowing through the inner tube. It is at this point where the coolant directed to the main pump 12 via line 28 is sub-cooled by the sub-cooling unit 40. A sub-cooling pump 54 is in fluid communication with the sub-cooling heat exchanger 46 and the condensing unit 24 via lines 56, 58, respectively, to pump the diverted coolant back to the condensing unit.

In summary, "acceptable" liquid coolant is directed from the condensing unit 24 to the main pump 12 via line 28. The valve 44, under manipulation of the controller 36, diverts a small portion of the mass of coolant to the components of the sub-cooling unit 40. The valve 44 may be configured to direct a select amount of coolant to the sub-cooling unit by the controller. For example, 2% of the total mass of coolant traveling to the main pump by line 28 may be diverted to the sub-cooling unit 40. The diverted coolant is expanded by the sub-cooling expansion valve 48, which significantly reduces the pressure and the temperature of the coolant. The sub-cooling heat exchanger 46 is designed to remove heat from the coolant in line 28 directed to the main pump 12 with the diverted sub-cooled coolant thereby ensuring that the coolant being directed to the main pump is in a liquid state.

Once heated by the heat exchanger 46, the vaporized coolant is pressurized by the liquid/vapor sub-cooling pump 54, which is in fluid communication with the sub-cooling heat exchanger and the condensing unit 24 via lines 56, 58, respectively. At this point, the pressure of the vaporized coolant is low, thereby requiring the provision of sub-cooling pump 54 to pressurize the coolant to a pressure sufficient for reintroduction into the line 26 carrying coolant from the evaporator (s) unit 18. Specifically, the liquid/vapor coolant is provided under pressure within line 58 and travels to line 26 where it is introduced back into the vaporized coolant traveling from the evaporator unit(s) 18. In one embodiment, the liquid/vapor pump 54 is a linear piston pump manufactured by Pumpworks Inc. of Minneapolis, Minn. The pressure of liquid/vapor coolant within line 58 is substantially similar to the pressure of vapor coolant in line 26, and once introduced back into line 26, the coolant travels to the condensing unit 24.

Thus, it should be observed that the sub-cooling unit 40 of the present invention may be employed in any one of the condensing units shown and described in the cooling system disclosed in U.S. patent application Ser. No. 10/993,329, entitled IT EQUIPMENT COOLING. The sub-cooling unit 40 is particularly effective in ensuring that coolant delivered to a pump is in a liquid state. The sub-cooling unit 40 relies on coolant within the closed system to sub-cool the coolant that is delivered to a main pump.

Figure 2:
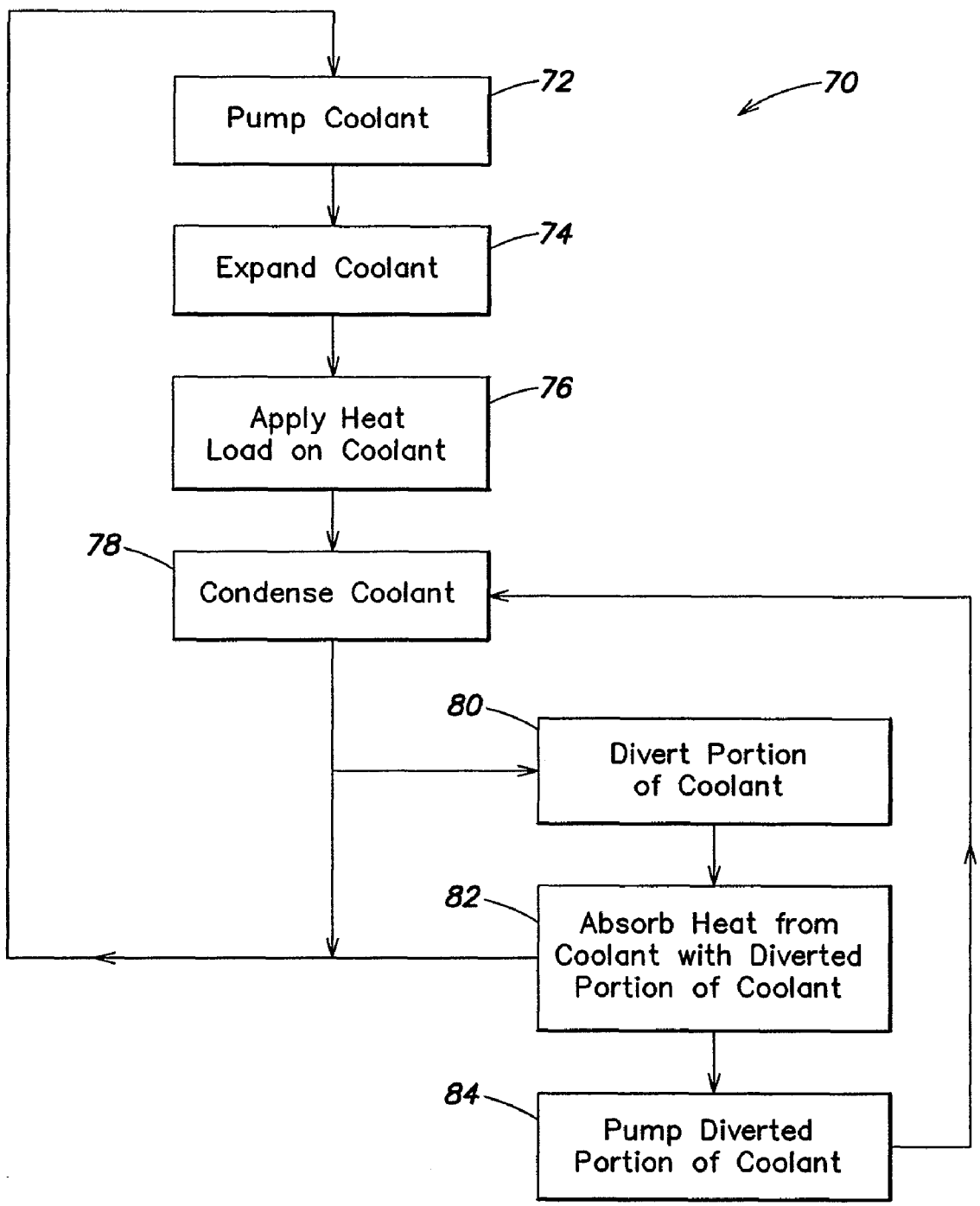
FIG. 2 is a flow diagram of a method of an embodiment of the invention for sub-cooling coolant of a cooling system.

Turning now to FIG. 2, a method of sub-cooling coolant within a cooling system, such as cooling system 10, is generally indicated at 70. At 72, coolant is pumped to an expansion device, such as expansion valve 14, by a pump, such as main pump 12. At 74, the expansion device expands the coolant so that the coolant is conditioned to receive a heat load. At 76, the heat load is applied to the coolant, the heat load being applied from a space requiring cooling, such as a space accommodating electronic equipment. The heat load applied to the coolant is typically sufficient to vaporize the coolant. Next, at 78, the coolant is condensed to a liquid state and directed back to the pump, where the cycle begins again.

Still referring to FIG. 2, at 80, a portion of coolant is diverted to a sub-cooling unit, such as sub-cooling unit 40, which is designed to sub-cool coolant flowing to the pump. The method of the present invention may divert a select amount of coolant, e.g., 2% of the coolant flowing to the main pump based on environmental conditions of the coolant exiting the condensing unit. At 82, the portion of diverted coolant enters a heat exchanger (e.g., heat exchanger 46) to absorb heat from the coolant traveling to the pump. The heat absorbed by the heat exchanger results in the further cooling of the coolant flowing to the pump. After absorbing heat of the coolant, the diverted portion of coolant is pumped back to the condensing unit at 84, which cools the liquid/vapor coolant.

It should be observed that the sub-cooling unit 40 of embodiments of the present invention may be used cooling systems other than the cooling system 10 illustrated in FIG. 1. The sub-cooling unit 40 may be employed in any system, whether a cooling or heating system, having a pump designed to pump liquid coolant. The provision of the sub-cooling unit 40 enables such systems to operate efficiently and more reliably.

Having thus described at least one embodiment of the present invention, various alternations, modifications and improvements will readily occur to those skilled in the art. Such alterations, modifications and improvements are intended to be within the scope and spirit of the invention. Accordingly, the foregoing description is by way of example only and is not intended to be limiting. The invention's limit is defined only in the following claims and equivalents thereto.

What is claimed is:

1. A cooling system comprising:
    a condensing unit having an inlet and an outlet;
    a coolant pump having an inlet, the coolant pump being configured to pump liquid coolant;
    a coolant line in fluid communication with the outlet of the condensing unit and the inlet of the coolant pump;
    a diverting valve located in the coolant line; and
    a sub-cooling unit configured to receive a portion of coolant from the coolant line through the diverting valve, the sub-cooling unit comprising:
        a sub-cooling expansion valve having an inlet in fluid communication with the diverting valve and an outlet;
        a sub-cooling heat exchanger having an inlet in fluid communication with the outlet of the sub-cooling expansion valve and an outlet, the sub-cooling heat exchanger being configured to transfer heat from coolant in the coolant line; and
        a sub-cooling pump having an inlet in fluid communication with the outlet of the sub-cooling heat exchanger and having an outlet in fluid communication with the inlet of the condensing unit.

2. The cooling system of claim 1, further comprising a controller in electrical communication with the diverting valve.

3. The cooling system of claim 2, wherein the controller is configured to determine an amount of coolant to direct to the sub-cooling unit based on environmental conditions of coolant at the coolant pump and within the sub-cooling unit.

4. The cooling system of claim 3, wherein the diverting valve is configured to divert less than five percent of coolant flowing through the coolant line to the sub-cooling unit.

5. The cooling system of claim 4, wherein the diverting valve is configured to divert approximately two percent of coolant flowing through the coolant line to the sub-cooling unit.

6. The cooling system of claim 1, wherein the sub-cooling unit is configured to cool coolant for delivery to the inlet of the coolant pump to a sufficiently cool temperature to ensure the coolant is in a liquid state at the inlet of the coolant pump.

7. The cooling system of claim 1, wherein the sub-cooling pump is adapted to pump a mixture of liquid coolant and vaporized coolant.

8. A method of cooling a space comprising:
cooling a coolant in a condensing unit having an inlet and an outlet;
directing the cooled coolant through a coolant line adapted to provide fluid communication between the outlet of the condensing unit and an inlet of a coolant pump configured to pump liquid coolant;
directing a portion of the coolant directed through the coolant line through a diverting valve configured to direct the portion of coolant to a sub-cooling unit, the sub-cooling unit comprising:
a sub-cooling expansion valve having an inlet in fluid communication with the diverting valve;
a sub-cooling heat exchanger having an inlet in fluid communication with an outlet of the sub-cooling expansion valve and adapted to transfer heat from coolant in the coolant line to the portion of coolant directed to the sub-cooling unit; and
a sub-cooling pump having an inlet in fluid communication with an outlet of the sub-cooling heat exchanger and having an outlet in fluid communication with the inlet of the condensing unit.

9. The method of claim 8, further comprising reducing a pressure and a temperature of the portion of the coolant in the sub-cooling expansion valve.

10. The method of claim 9, wherein reducing the pressure and the temperature of the portion of the coolant in the sub-cooling expansion valve comprises changing a phase of a second portion of the coolant from liquid to vapor.

11. The method of claim 8, further comprising directing the portion of coolant from the diverting valve to the inlet of the sub-cooling expansion valve.

12. The method of claim 11, further comprising directing the portion of coolant from the outlet of the sub-cooling expansion valve to the inlet of the sub-cooling heat exchanger.

13. The method of claim 12, further comprising directing the portion of coolant from the outlet of the sub-cooling heat exchanger to the inlet of the sub-cooling pump.

14. The method of claim 13, further comprising directing the portion of coolant from the outlet of the sub-cooling pump to the inlet of the condensing unit.

15. The method of claim 8, further comprising controlling the amount of coolant directed through the diverting valve with a controller in electrical communication with the diverting valve.

16. The method of claim 8, further comprising directing coolant from an outlet of the condensing unit to an inlet of an evaporator unit.

17. The method of claim 16, further comprising directing coolant from an outlet of the evaporator unit to the inlet of the condensing unit.

18. The method of claim 17, further comprising combining the portion of coolant with the coolant directed from the outlet of the evaporator unit to the inlet of the condensing unit.

19. The method of claim 17, wherein directing the portion of coolant through the sub-cooling pump comprises increasing a pressure of the portion of coolant to a pressure substantially similar to a pressure of the coolant directed from the outlet of the evaporator unit to the inlet of the condensing unit.

20. The method of claim 8, wherein directing the portion of coolant through the sub-cooling pump comprises changing a phase of a third portion of the coolant from vapor to liquid.

* * * * *